US009476951B2

(12) United States Patent
Orozco et al.

(10) Patent No.: US 9,476,951 B2
(45) Date of Patent: Oct. 25, 2016

(54) DC SQUID BASED RF MAGNETOMETER OPERATING AT A BANDWIDTH OF 200 MHZ AND HIGHER

(75) Inventors: Antonio Orozco, Washington, DC (US); Vladimir V. Talanov, Ellicott City, MD (US); Alfred Benjamin Cawthorne, III, Franklin, TN (US); Nesco Mario Lettsome, Jr., Beltsville, MD (US)

(73) Assignee: Neocera, LLC, Beltsville, MD (US)

( * ) Notice: Subject to any disclaimer, the term of this patent is extended or adjusted under 35 U.S.C. 154(b) by 286 days.

(21) Appl. No.: 14/351,374

(22) PCT Filed: Nov. 14, 2011

(86) PCT No.: PCT/US2011/060589
§ 371 (c)(1),
(2), (4) Date: Apr. 11, 2014

(87) PCT Pub. No.: WO2013/074067
PCT Pub. Date: May 23, 2013

(65) Prior Publication Data
US 2014/0249033 A1    Sep. 4, 2014

(51) Int. Cl.
*G01R 33/035* (2006.01)
(52) U.S. Cl.
CPC ......... *G01R 33/0356* (2013.01); *G01R 33/035* (2013.01)
(58) Field of Classification Search
CPC .......... G01R 33/0354; G01R 33/0356; G01R 33/0358
See application file for complete search history.

(56) References Cited

U.S. PATENT DOCUMENTS

| 5,355,085 A | * | 10/1994 | Igarashi ............. G01R 33/0356 324/248 |
| 6,356,078 B1 | * | 3/2002 | Ganther, Jr. ........ G01R 33/0356 324/248 |

(Continued)

FOREIGN PATENT DOCUMENTS

WO    WO 9418576 A2  *  8/1994  ......... G01R 33/0356

OTHER PUBLICATIONS

Jenks, William G., et al. "SQUIDs." Encyclopedia of applied physics 19 (1997): 457-468.*
Inamdar, Amol, et al. "Quarter-rate superconducting modulator for improved high resolution analog-to-digital converter." Applied Superconductivity, IEEE Transactions on 17.2 (2007): 446-450.*
F. Wellstood, et al., "Integrated dc SQUID magnetometer with a high slew rate," Rev. Sci. Instr. 55, 952, 1984.
D. Drung, "High-Tc and low-Tc dc SQUID electronics," Supercond Sci. Technology, 16, 1320, 2003.

(Continued)

*Primary Examiner* — Huy Q Phan
*Assistant Examiner* — Adam Clarke
(74) *Attorney, Agent, or Firm* — Rosenberg, Klein & Lee (57) ABSTRACT

An RF DC SQUID based magnetometer capable of sensing coherent magnetic fields up to 200 MHz and higher is developed which overcomes frequency limitations associated with noise signals due to transmission line delays between the SQUID circuit and readout electronics. The bandwidth limitations are overcome by superimposing the RF flux on the modulation flux to produce at the SQUID output a binary phase modulated RF voltage, which is processed to lock the static flux, and to control modulation regime by producing an AC bias for the RF flux. RF readout electronics based on a double lock-in technique (sequential demodulation of the RF SQUID voltage at the modulation flux frequency $\omega_m$ and the RF flux frequency $\omega_{RF}$), yields a signal proportional to the product of amplitude and phase cosine of RF flux with linear dynamic range up to five orders in magnitude if compared to DC SQUID operated in traditional flux-locked loop regime.

15 Claims, 11 Drawing Sheets

(56) References Cited

U.S. PATENT DOCUMENTS

| | | | |
|---|---|---|---|
| 7,248,044 B2* | 7/2007 | Kobayashi | G01R 33/0354 324/248 |
| 8,593,141 B1* | 11/2013 | Radparvar | G01R 33/323 324/248 |
| 2005/0206376 A1* | 9/2005 | Matthews | B82Y 35/00 324/248 |
| 2006/0164081 A1* | 7/2006 | Ganther, Jr. | G01R 33/0354 324/248 |
| 2011/0285393 A1* | 11/2011 | Zakosarenko | G01R 33/035 324/248 |

OTHER PUBLICATIONS

D. Drung, et al., "dc SQUID Readout Electronics With Up to 100MHz Closed-Loop Bandwidth," IEEE Trans. Appl. Supercond. 15, 777, 2005.

R. C. Black, et al. "Imaging radiofrequency fields using a scanning SQUID microscope," Appl. Phys. Lett, 66, 1267, 1995.

J. Matthews, et al. "Sampling Method to Extend Bandwidth of Scanning SQUID Microscopes," IEEE Trans Appl. Supercond., 15, 688, 2005.

* cited by examiner

DC SQUID BASED RF MAGNETOMETER OPERATING AT A BANDWIDTH OF 200 MHZ AND HIGHER

The work was funded by the NSF-SBIR contract Number IIP-0924610. The United States Government has certain rights to the Invention.

FIELD OF THE INVENTION

The present invention is directed to magnetic measurements, and specifically to magnetic measurements which are carried out with a Superconducting Quantum Interference Device (SQUID) magnetometer.

Further, the present invention is directed to a DC SQUID based RF (radio frequency) magnetometer capable of sensing coherent magnetic fields in a diapason of 200 MHz and higher.

The present invention is further directed to a DC SQUID magnetometer with 200 MHz (and higher) bandwidths in which an RF flux emanating from a sample under study is superimposed on the modulation flux to produce a binary phase modulated RF voltage at the SQUID output which is demodulated with the use of a double lock-in technique (at the frequency $\omega_m$ of the modulation flux and at the frequency $\omega_{RF}$ of the RF flux) to produce an output signal which retains information about the amplitude and phase of the measured RF magnetic field.

BACKGROUND OF THE INVENTION

Superconducting Quantum Interference Device (SQUID) is the most sensitive detector of magnetic field (F. Wellstood, et al., "Integrated DC SQUID magnetometer with a high slew rate," Rev. Sci. Instr. 55, 952, 1984) which energy resolution approaches quantum limit. The interfering paths in DC SQUID are formed by two Josephson junctions connected in parallel.

Figure 1:
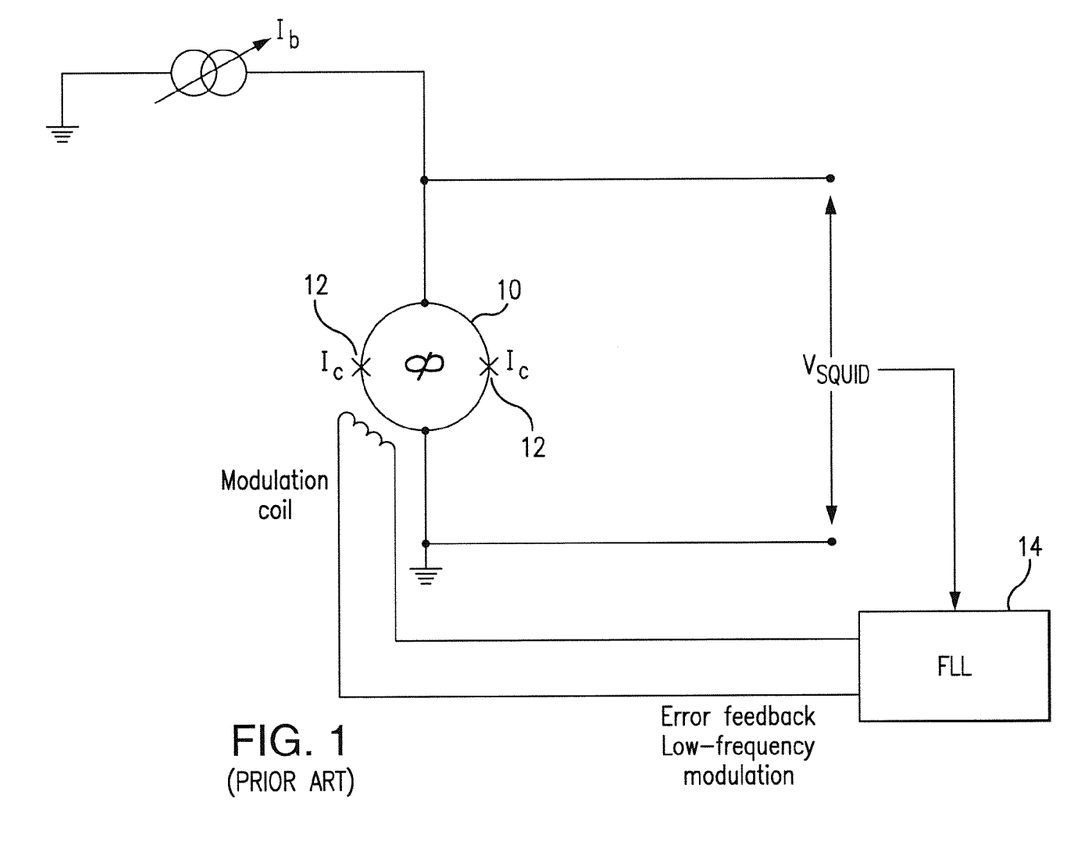
FIG. 1 is a schematic block-diagram of DC SQUID of the prior art operating on FLL regime.

Specifically, as shown in FIG. 1, a SQUID 10 is composed of two Josephson tunnel junctions 12 that are connected together in a superconducting loop. Each Josephson junction is formed by two superconducting regions that are separated by thin insulating barrier. Current exists in the Josephson junction without any voltage drop, up to a maximum value of the critical current Ic. When the SQUID is biased with a constant current $I_b$ that exceeds the critical current of the Josephson junction, the changes in the magnetic flux $\Phi$ surrounding the SQUID loop produce changes in the voltage drop $V_{SQUID}$ across the SQUID.

The produced SQUID voltage $V_{SQUID}$ is a periodic non-linear function of magnetic flux (V-$\Phi$ function) threading the SQUID loop:

$$V_{SQUID} = 0.5R\sqrt{I_b^2 - 4I_c^2 \cos^2(\pi\Phi/\Phi_0)} \quad \text{(Eq. 1)}$$

where R is the normal resistance of Josephson junction, $I_b$ is the SQUID bias current, $I_c$ is the Josephson critical current, $\Phi$ is the SQUID magnetic flux, and $\Phi_0 = \pi\hbar/e \sim 2.07 \times 10^{-15}$ Wb is the magnetic flux quantum with the reduced Planck constant $\hbar$ and the electron charge e.

In order to linearize the non-linear SQUID response and increase its dynamic range, SQUID magnetometers are typically operated in a flux-locked loop (FLL) regime (D. Drung, Supercond Sci. Technology, 16, 1320, 2003). Specifically, in order to convert the nonlinear response to a linear signal, a negative feedback circuit 14 is used to apply an "error" feedback flux to the SQUID in order to maintain a constant total flux through the SQUID. Where the SQUID is "locked" at $n\Phi_0$ by means of flux locked loop (FLL), the magnitude of the "error" feedback flux is proportional to the external magnetic field applied to the SQUID.

In order to obtain an optimum feedback system, a modulation technique usually is employed. An oscillator operating at the modulation frequency $\omega_m$, and a coil responsive thereto cooperate to modulate the flux threading the SQUID loop. A magnetic flux oscillating at $\omega_m$ with amplitude on the order of $\Phi_0$ is inductively coupled to the SQUID circuit by means of the modulation coil. When static flux equals $n\Phi_0$, n=0, 1, 2, . . . , the SQUID produces only even harmonics of the modulation flux $2\omega_m$. This is demodulated by a lock-in amplifier in the FLL circuit referenced to $\omega_m$, which yields a zero output. If the static flux becomes greater or less than $n\Phi_0$, the lock-in amplifier outputs a positive or negative voltage, respectively, due to existence of a fundamental harmonic in the SQUID voltage. Output of the lock-in amplifier is integrated and fed back into the SQUID via the modulation coil. Thus, the SQUID performs as a null detector with the feedback signal ("error" signal) serving as a measure of magnetic field.

Because of delay in transmission lines connecting the SQUID to room temperature electronics, the closed loop bandwidth of SQUID magnetometers is fundamentally limited to 20 MHz (D. Drung, et al., IEEE Trans. Appl. Supercond. 15, 777, 2005), although state of the art schemes allow increasing it up to 50-100 MHz (D. Drung, Supercond. Sci. Technology, 16, 1320, 2003).

To overcome this limitation, a technique for sensing radio-frequency (RF) and microwave magnetic fields was designed where nonlinearity of the V-$\Phi$ function of the SQUID is used for rectification of the RF field (R. C. Black, et al. "Imaging radio-frequency fields using a scanning SQUID microscope," Appl. Phys. Lett, 66, 1267, 1995).

Recently, a scanning SQUID microscope was demonstrated which is capable of measuring GHz magnetic fields by using a hysteretic DC SQUID and a pulsed sampling technique (J. Matthews, et al. "Sampling method to extend bandwidth of scanning SQUID microscopes," IEEE Trans Appl. Supercond., 15, 688, 2005). Major disadvantage of above schemes is the open loop operation.

Another issue often hampering RF applications of SQUIDs is capacitive and/or inductive near-field coupling (i.e., "cross-talk", "coherent pick-up") between various parts of the measurement setup. Since the size of the measurement system and the length of cables connecting SQUID and electronics are about $\lambda \sim 1$ m, they both behave like antennas. Unlike the condition at low (below 10 MHz) or microwave (above >3 GHz) frequencies, where the system size is much greater or much less than $\lambda$, respectively, there are created spurious RF signals, which may overshadow a low level SQUID signal. Additionally, an impedance mismatch between the SQUID dynamic resistance ($\sim 1\Omega$) and RF electronics input ($50\Omega$) may affect the signal integrity and detectability as well.

An RF magnetometer based on DC SQUID which is capable of detecting coherent magnetic fields up to and higher than 200 MHz is a long-lasting need in the field of SQUID magnetometry.

SUMMARY OF THE INVENTION

It is therefore an object of the present invention to provide an RF magnetometer based on a DC SQUID which is capable of detecting coherent magnetic fields at bandwidths of 200 MHz and higher.

It is another object of the present invention to provide an RF magnetometer based on the DC SQUID in which the FLL (flux-locked loop) bandwidth limitations are overcome by using a flux-locked loop that locks the static flux and creates AC bias for the RF flux at the maximum slope of the VA) function of the DC SQUID.

It is a further object of the present invention to provide a DC SQUID based RF magnetometer operating in the bandwidths of 200 MHz and higher in which an RF magnetic field emanating from the sample under study is superimposed on the modulation flux. The superposition of the RF and modulation fluxes results in generation of the SQUID output RF voltage which is binary phase modulated. The $V_{SQUID}$ is processed to demodulate the RF component of the produced SQUID voltage at two frequencies, $\omega_m$ and $\omega_{RF}$, to produce a low frequency IF (intermediate frequency) signal which retains information about the amplitude and the phase of the RF magnetic field.

In one aspect, the present invention is an RF magnetometer system operating at a bandwidth of 200 MHz and higher, which comprises:

a DC SQUID circuit, and a flux-locked loop circuit coupled between an input and output of the DC SQUID circuit to inductively couple a feedback flux to the input of the DC SQUID circuit. The feedback flux subtracted from the external quasi-static flux yields $n\Phi_0$, n=0, 1, 2, . . . , where $\Phi_0$ is the magnetic flux quantum.

A source of the low-frequency modulation flux $\Phi_m$ sin $(\omega_m t+\phi_m)$ is inductively coupled to the input of the DC SQUID circuit, wherein $\Phi_m$ is the amplitude of the modulation flux, $\omega_m$ is the frequency of the modulation flux, and $\phi_m$ is the phase of the modulation flux.

Further, a source of RF flux $\Phi_{RF}(t)\sin(\omega_{RF} t+\phi_{RF})$ is inductively coupled to the input of the DC SQUID circuit, where $\Phi_{RF}(t)$ is an amplitude of the RF flux, $\omega_{RF}$ is a frequency of the RF flux, and $\phi_{RF}$ is the phase of the RF flux.

In the subject magnetometer, the DC SQUID circuit produces an output RF voltage which is binary phase modulated at the frequency $\omega_m$ between 0° and 180°.

A demultiplexing circuit is coupled to the output of the DC SQUID to separate the output RF voltage into an RF signal component and a low-frequency signal component. An RF demodulation circuit is coupled to the demultiplexing circuit to receive the RF signal component of the binary phase modulated output RF voltage and to produce an output signal representative of the RF flux to be measured.

The RF demodulation circuit includes a first demodulation unit referenced to the $\omega_{RF}$ and a second demodulation unit referenced to the $\omega_m$ and coupled to an output of the first demodulation unit. The double lock-in mechanism provided by the double demodulation scheme substantially eliminates parasitic signals which are coherent with the RF SQUID voltage. The second demodulation unit is sensitive only to a low-frequency signal associated with the SQUID but rejects the parasitic signals which would otherwise hamper the RF magnetic field detection.

The first demodulation unit may be in the form of an RF lock-in amplifier referenced to the $\omega_{RF}$, or in the form of an RF mixer/multiplier circuit.

The second demodulation unit may be based on an Intermediate Frequency (IF) lock-in amplifier referenced to the $\omega_m$, or on a multiplier circuit.

The FLL circuit is coupled to an output of the demultiplexing circuit to receive the low-frequency signal component therefrom. The low-frequency signal component is processed in the FLL circuit to generate the feedback flux, which when subtracted from the external quasi-static flux, yield the net quasi-static flux of $n\Phi_0$. The flux-locked loop (FLL) circuit may include an FLL lock-in amplifier referenced to the $\omega_m$, or a multiplier unit.

The source of low-frequency modulation flux may include a function generator producing the low-frequency modulation flux to be coupled to the flux-locked loop circuit and to the second demodulation unit. Alternatively, the source of low-frequency modulation flux may include a local oscillator signal received from the IF lock-in amplifier. The second demodulation unit is coupled to the FLL to define the modulation regime.

The source of RF flux may include a magnetic flux emanating from a sample under study. In addition, an RF power source may be coupled to the first demodulation unit and to the source of RF flux. In this embodiment, an attenuator is coupled between the first demodulation unit and the sample under study. Alternatively, RF power may be fed into the modulation coil, providing a net flux which is a superposition of the modulation flux, quasi-static flux locked at $n\Phi_0$, and RF magnetic flux.

A modulation coil is located in close proximity of and inductively coupled to the DC SQUID circuit to couple the low-frequency modulation flux and the feedback flux to the DC SQUID circuit. The RF demodulation circuit includes at least one balanced low-noise amplifier (LNA) coupled to an output of the demultiplexing circuit and an amplifier coupled between the first and second demodulation units. The demultiplexing circuit includes at least one bias-T circuit.

The $\omega_m \ll \omega_{RF}$, and the $\omega_m$ falls within an output bandwidth of the first demodulator unit.

In another aspect, the present invention constitutes a method for measuring RF magnetic field of a sample under study by a DC SQUID magnetometer operating at a bandwidth of 200 MHz and higher. The subject method comprises the steps of:

(a) providing a RF power to a sample under study, (b) inductively coupling a low-frequency modulation flux $\Phi_m \sin(\omega_m t+\phi_m)$, and an RF flux emanating from the sample under study and superimposed on the modulating flux to a DC SQUID circuit, where $\Phi_m$, $\omega_m$ and $\phi_m$, are an amplitude, frequency, and phase of the modulation flux, respectively, and $\Phi_{RF}$, $\omega_{RF}$, and $\phi_{RF}$, are an amplitude, frequency and phase of the RF flux received from the sample under study, respectively, (c) acquiring at an output of the DC SQUID circuit an output RF voltage binary phase modulated at the frequency $\omega_m$, between 0° and 180°, (d) demultiplexing the output RF voltage into an RF signal component and a low-frequency signal component, and (e) demodulating sequentially the RF signal component of the binary phase modulated output RF voltage at a first and second demodulation unites referenced to the frequencies of $\omega_{RF}$ and $\omega_m$, respectively, to obtain at an output of the second demodulation unit an output signal representative of the RF flux emanating from the sample under study, where the $\omega_m \ll \omega_{RF}$, and where the $\omega_m$ falls within an output bandwidth of the first demodulator unit.

The low-frequency signal component is fed from the demultiplexing unit into a flux-locked loop circuit to generate a feedback flux, so that the DC SQUID circuit is locked at quasi-static flux $n\Phi_0$, n=0, 1, 2, . . . , where $\Phi_0$ is the magnetic flux quantum.

These and other features and advantages of the present invention will become apparent from the following detailed description of the present invention when taken in conjunction with the accompanying patent drawings.

DETAILED DESCRIPTION OF THE PRESENT INVENTION

The ultimate goal of the present invention is to employ DC SQUID to create an output signal (IF signal, to be discussed in details in further paragraphs) that is a measure of RF magnetic field emanating from a sample of interest. Since the SQUID intrinsic bandwidth maybe as high as hundreds of GHz, the SQUID itself is not presenting a limiting factor. But the RF field oscillates at frequency which falls outside the FLL (flux-locked loop) bandwidth, i.e. higher than 20 MHz. For this reason, the flux-locked loop typically used in conjunction with DC SQUIDs will not respond to the measured RF field.

In order to overcome the FLL bandwidth limitation, the low frequency FLL is provided with the function of simultaneously locking the static flux for the DC SQUID as well as creating the AC bias for the RF flux at the maximum slope of the V-Φ function of the DC SQUID.

In the subject magnetometer, the RF flux emanating from the sample under study is superimposed on top of the modulation flux. Once the RF flux is applied, the SQUID outputs an RF voltage that is binary phase modulated (as will be presented in following paragraphs), i.e. the output RF voltage produced by the SQUID circuit has the 0° phase during a first half period of modulation and has 180° phase during the second half-period of modulation. This signal is demodulated by a double lock-in amplifier technique, in such a way that the final signal (i.e., the IF signal) retains information about the amplitude and, ideally, the phase of RF magnetic field.

The double lock-in amplifier technique along with the differential signal link efficiently mitigates the spurious signals issue. In the present magnetometer, the operating frequency is limited only by the bandwidths of the RF lock-in demodulator (to be detailed in further paragraphs) and may be extended into GHz frequency range.

Principle of Operation

Referring to FIGS. 2-7, the RF magnetometer 20 is based on DC SQUID circuit 22 which is built with two Josephson tunnel junctions 24 connected together in a superconducting loop 26. When the SQUID circuit 22 is biased with a constant current that exceeds the critical current of the junction (the current existing in the junction without any voltage drop up to a maximum value of the critical current), the changes in the magnetic flux Φ threading the SQUID loop produce changes in the voltage drop across the SQUID, further referred to herein as SQUID response.

In order to linearize the SQUID response and increase its dynamic range, the SQUID magnetometer is operated in a flux-locked loop (FLL) regime. In this regime, a flux-locked loop circuit 28 is connected to the SQUID circuit 22 through a demultiplexing circuit 30.

The FLL circuit 28 includes a current source 32 (also referred to herein as "bias") producing the constant current $I_b$ to bias the SQUID circuit, decoupling capacitors 34, step up transformer 36, low noise amplifier 38, FLL lock-in amplifier 40, feedback resistors 44, current adder 46, and modulation coil 48 which is positioned in close proximity to the SQUID circuit 22 to inductively couple the modulation flux and the feedback flux to the SQUID circuit 22, as will be detailed in further paragraphs.

Figure 7:
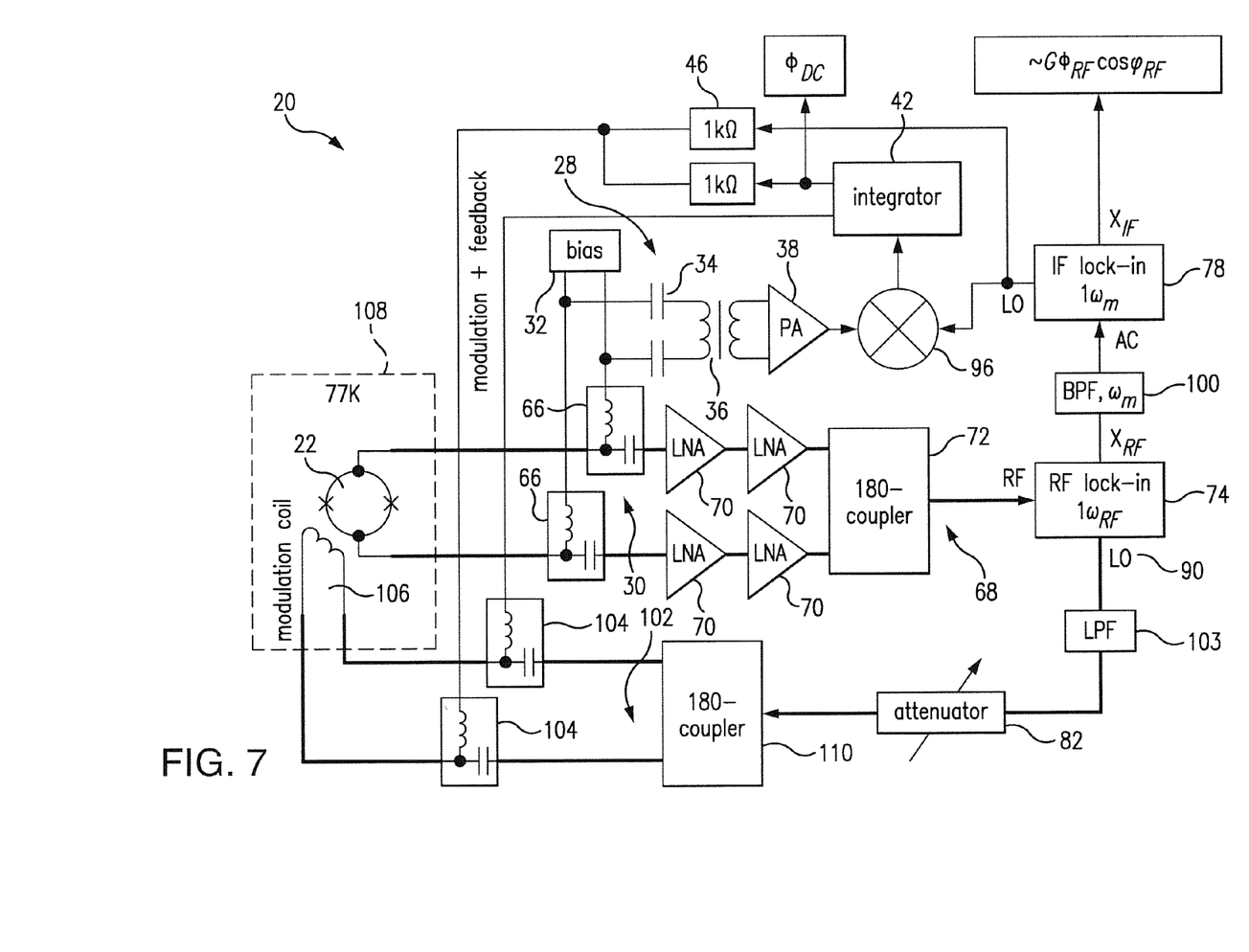
Figure 8:
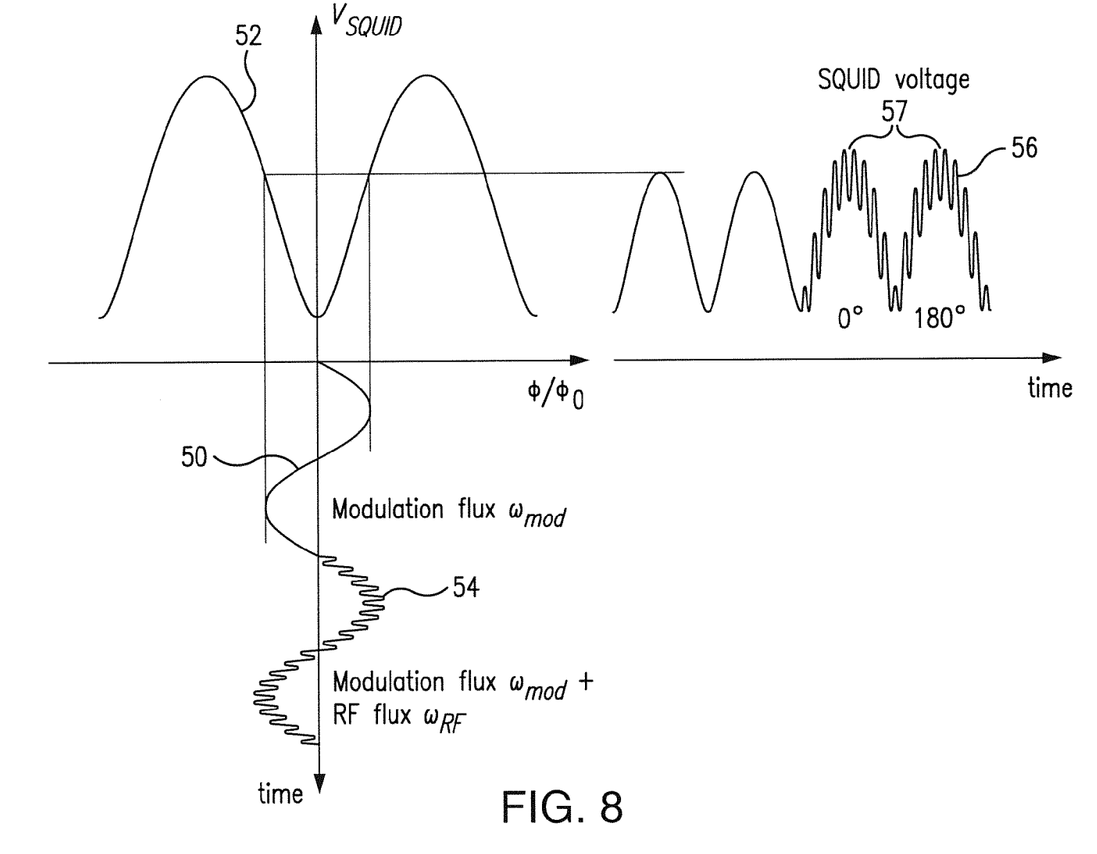
FIG. 8 is a V-Φ diagram illustrating principles of binary phase modulation for SQUID RE voltage, where the modulation flux at $\omega_m$ is shown to serve as AC bias for RF flux as well as the modulation flux for FLL.
Figure 9:
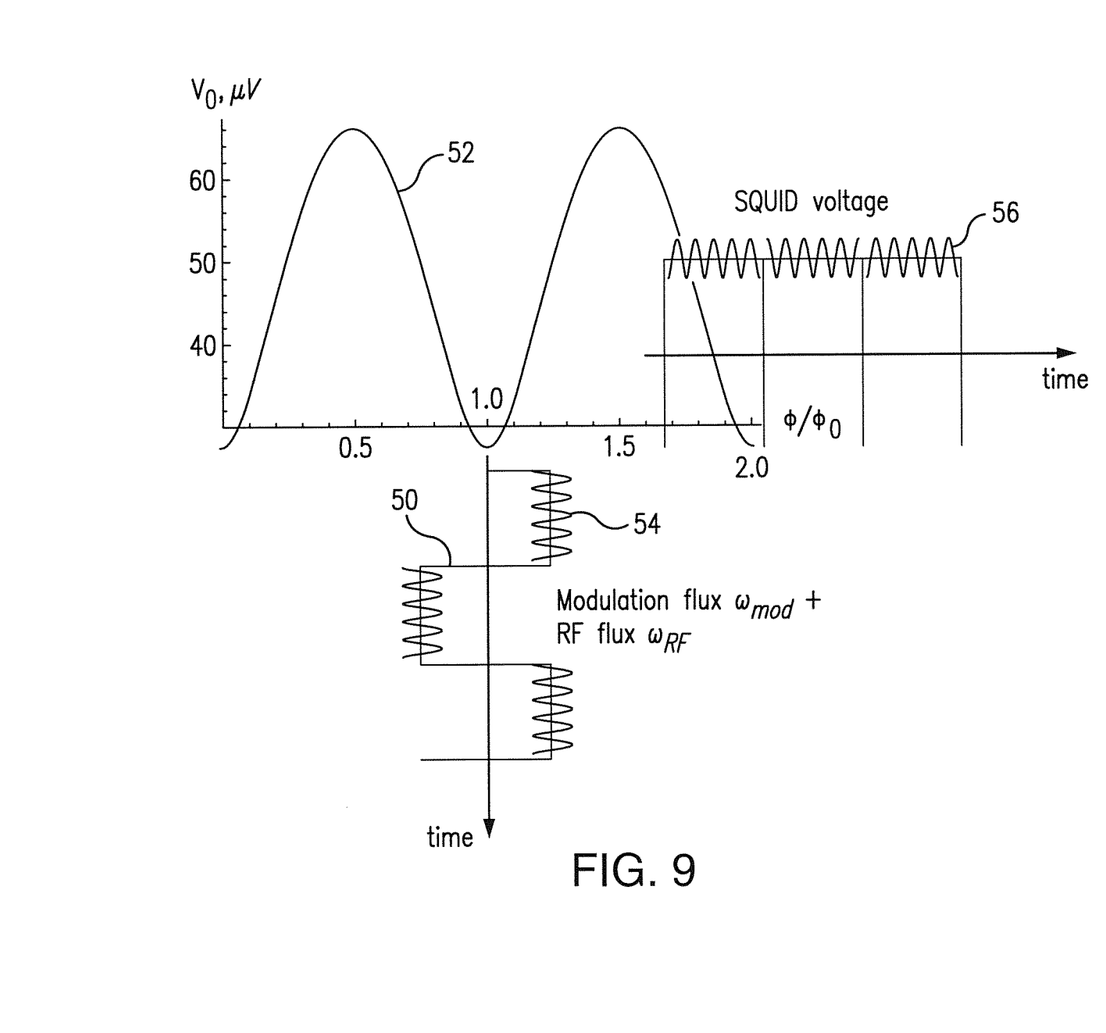
FIG. 9 is a V-Φ diagram illustrating principles of binary phase modulation for SQUID RF voltage with a square-wave modulation.

Referring again to FIGS. 2-7, and to FIGS. 8-9, a magnetic flux oscillating at the frequency of $\omega_m$ with an amplitude of about $\Phi_0/4$ is applied to the SQUID circuit 22 by means of the modulation coil 48 placed in close proximity and inductively coupled to the SQUID circuit 22. Modulation frequency $\omega_m$ could be in the range from 100 Hz to 5 MHz.

The lock-in amplifier 40 referenced to the frequency $\omega_m$ demodulates the SQUID output voltage, which output is integrated with the integrator 42, inverted, and fed back into the modulation coil through a feedback resistor 44 and the current adder 46.

When the SQUID's quasi-static flux is $n\Phi_0$, n=0, 1, 2, ..., the lock-in output of the FLL lock-in amplifier 40 is zero since the SQUID's voltage contains no fundamental harmonic. If the quasi-static flux is greater or lower than an $n\Phi_0$, the output of the lock-in amplifier 40 is positive or negative, respectively, with the feedback signal proportional to the quasi-static magnetic field $\Phi_{DC}$.

A modulation flux $\Phi_m \sin(\omega_m t + \phi_m)$ is applied to the SQUID circuit via modulation coil 48, and the SQUID quasi-static flux is "locked" at $n\Phi_0$. Referring to FIGS. 8-9, considering the DC SQUID 22 incorporated into the FLL circuit 28 with the modulation flux $\Phi_m \sin(\omega_m t + \phi_m)$, which is "locked" to the minimum of V-Φ function $n\Phi_0$, the application of RF magnetic flux $\Phi_{RF}(t)\sin(\omega_{RF}t + \phi_{RF})$ to the SQUID makes the total flux threading the SQUID loop equal $$\Phi_{RF}(t)\sin(\omega_{RF}t+\phi_{RF})+n\Phi_0+\Phi_m \sin(\omega_m t+\phi_m) \quad \text{(Eq. 2)}$$

If $\Phi_{RF}(t)<\Phi_0/4$ and $\Phi_m \sim \Phi_0/4$, the SQUID outputs an RF voltage which is binary phase modulated at $\omega_m$ between 0 degrees (for $\sin(\omega_m t+\phi_m)>0$) and 180 degrees (for $\sin(\omega_m t+\phi_m)<0$). That is, for example, a square-wave modulation would bias the SQUID at maximum slope of V-Φ function for each half-period, as shown in FIG. 9. The square wave 50 is a low-frequency modulation flux used to provide an error (feedback) signal for FLL. During the first half-period modulation flux has a value of 1.25 $\Phi/\Phi_0$, and effectively biases the SQUID at the highest-positive slope of V-Φ curve 52. The same happens during the second half-period, when the modulation flux 50 is 0.75 $\Phi/\Phi_0$. But here the SQUID is biased at the highest-negative slope of V-Φ curve 52.

If an RF flux 54 is superimposed on top of the modulation flux 50, the SQUID will output RF voltage ("SQUID voltage") 56 with amplitude proportional to the slope of V-Φ curve at 1.25 Φ/Φ$_0$ or (0.75 Φ/Φ$_0$) multiplied by the amplitude of the RF flux 54. In other words, from RF flux stand-point the SQUID appears to be "biased" at 1.25 Φ/Φ$_0$ and 0.75 Φ/Φ$_0$ during the first and second half-periods of modulation, respectively.

Further, the SQUID RF voltage 56 is binary phase modulated, between 0 and 180 degrees, at the modulation frequency ω$_m$, as shown in FIG. 8, in the peaks 57 of the curve 56. RF voltage has the 0-degree phase (due to positive slope) during the first half-period of modulation, and has 180-degree phase (due to negative slope) during the second half-period of modulation.

Returning to FIGS. 2-7, after demultiplexing at the demultiplexing circuit 30, the SQUID voltage 60 is separated into a low frequency signal component 62 and RF frequency signal component 64. The demultiplexing circuit 30 may be implemented with a single bias-T circuit 66 (as presented in FIG. 3), or double bias-T circuits 66 (as shown in FIGS. 2 and 4-7) performing high-pass filtering for the SQUID's output RF voltage 60.

After isolation from the output SQUID's RF voltage 60, the RF signal 64 is processed by an RF demodulation circuit 68 in which the RF signal component 64 is first amplified with balanced low-noise RF amplifier(s) 70, and, as shown in embodiments presented in FIGS. 2 and 4-7, is converted from the differential into single-ended signal by a 180-degree coupler 72.

The coupler's output is demodulated by an RF lock-in amplifier 74 referenced to ω$_{RF}$, which output, via an amplifier 76, is fed into intermediate frequency (IF) lock-in amplifier 78 referenced to ω$_m$. For proper operation, the output bandwidth of the RF lock-in amplifier 74 is greater than ω$_m$, i.e., ω$_m$ falls within the output bandwidth of RF lock-in amplifier 74.

As presented in following paragraphs, the in-phase output X$_{IF}$ (IF signal) of IF lock-in amplifier 78 is proportional to both the amplitude and phase of RF magnetic field:

$$X_{IF}=G_{tot}\Phi_{RF}(t)\cos\phi_{RF} \quad (\text{Eq. 3})$$

where G$_{tot}$ is the total gain of the system.

Simultaneously, the DC output (low-frequency signal component 62) of the bias-T circuit 66 is fed into the FLL circuit 28 which feedback yields a traditional measure of the SQUID's static flux.

Due to the ω$_{RF}$≫ω$_m$, the RF demodulation circuit 74 and FLL circuit 28 run simultaneously without affecting each other. As shown in FIGS. 2-7, the demodulation circuit 78 (or 92) is coupled to the FLL 28 to determine the modulation regime. For example, in the case of a square-wave modulation (as shown in FIG. 9), the SQUID would be biased at the maximum slope (positive and negative) of V-Φ function for each half-period, respectively. Since the spurious RF signals originating outside the SQUID loop carry no phase modulation, they are efficiently eliminated by the double lock-in technique.

Figure 2:
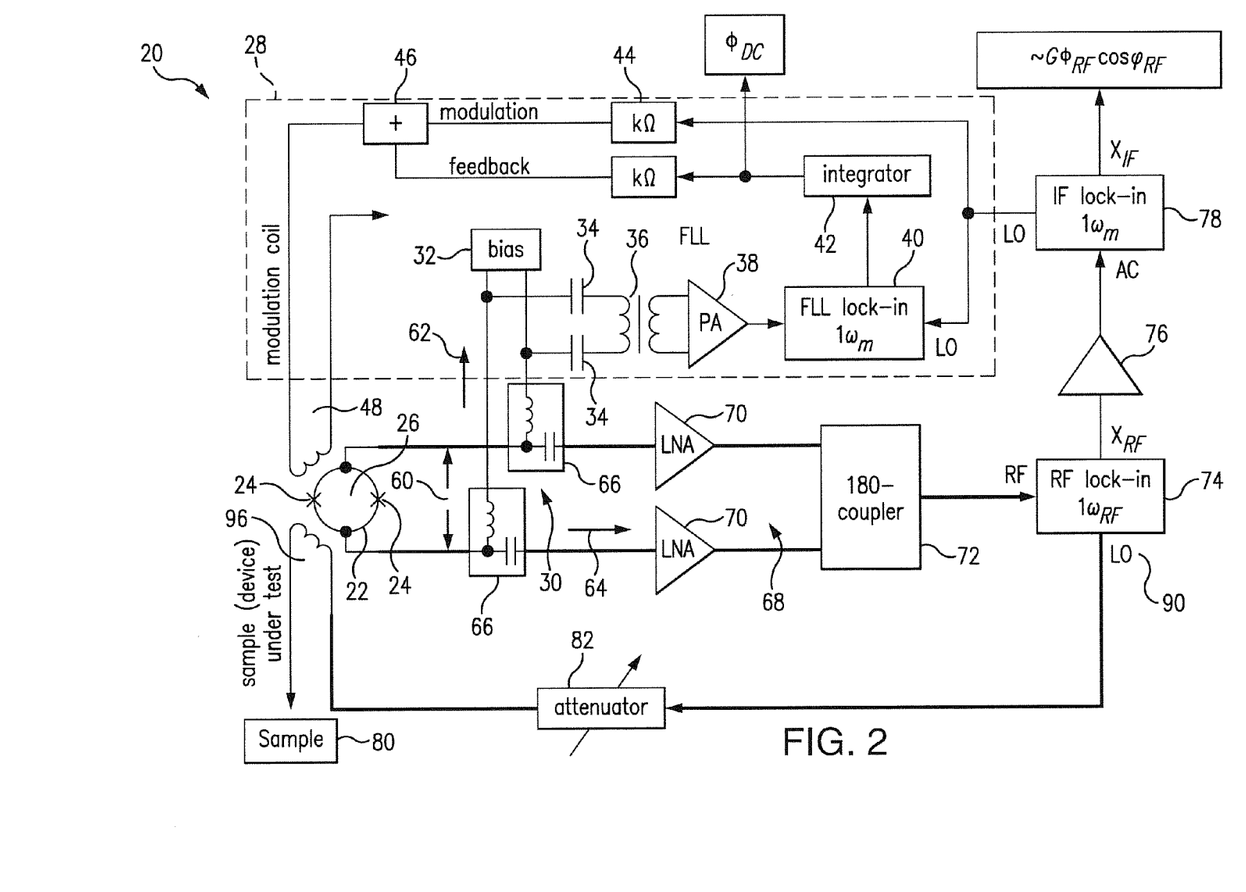
FIGS. 2-7 are electrical block-diagrams representative of alternative embodiments of the RF magnetometer of the present invention.
Figure 3:
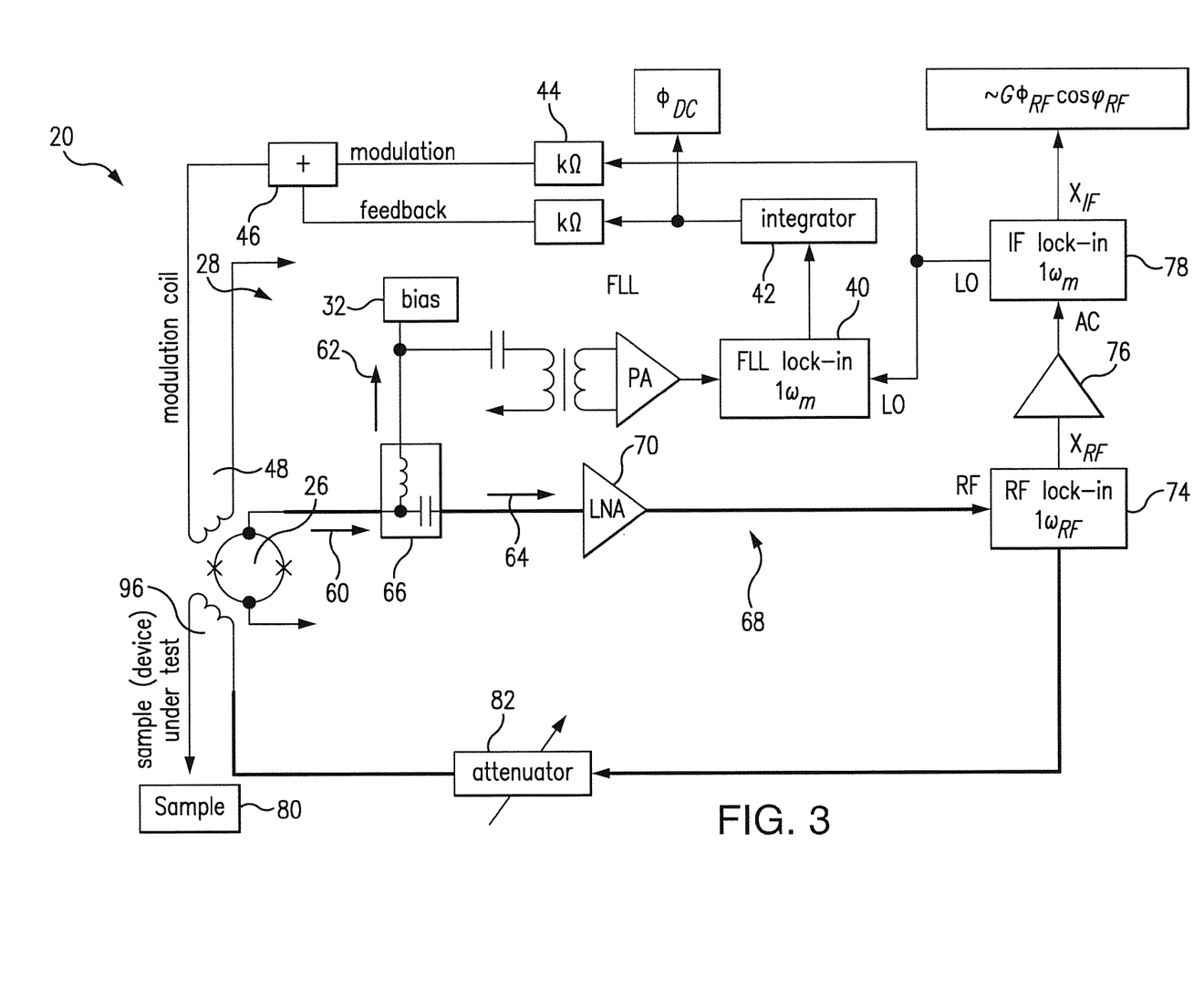

As shown in FIGS. 2-3, RF power is supplied from the RF lock-in 74 to a sample under study 80 via a variable attenuator 82. In this embodiment the range of RF frequency could be from 50 MHz up to 200 MHz.

In the alternative embodiment of the RF magnetometer of the present invention shown in FIG. 3, a single-ended configuration with a single bias-T circuit 66, single decoupling capacitor 34, and single RF LNA amplifier 70 is used in the RF demodulation circuit 68. In this embodiment, the 180-degree coupler 72 of FIG. 2 is omitted and the RF frequency bandwidths may range from approximately 50 MHz up to 200 MHz.

Figure 4:
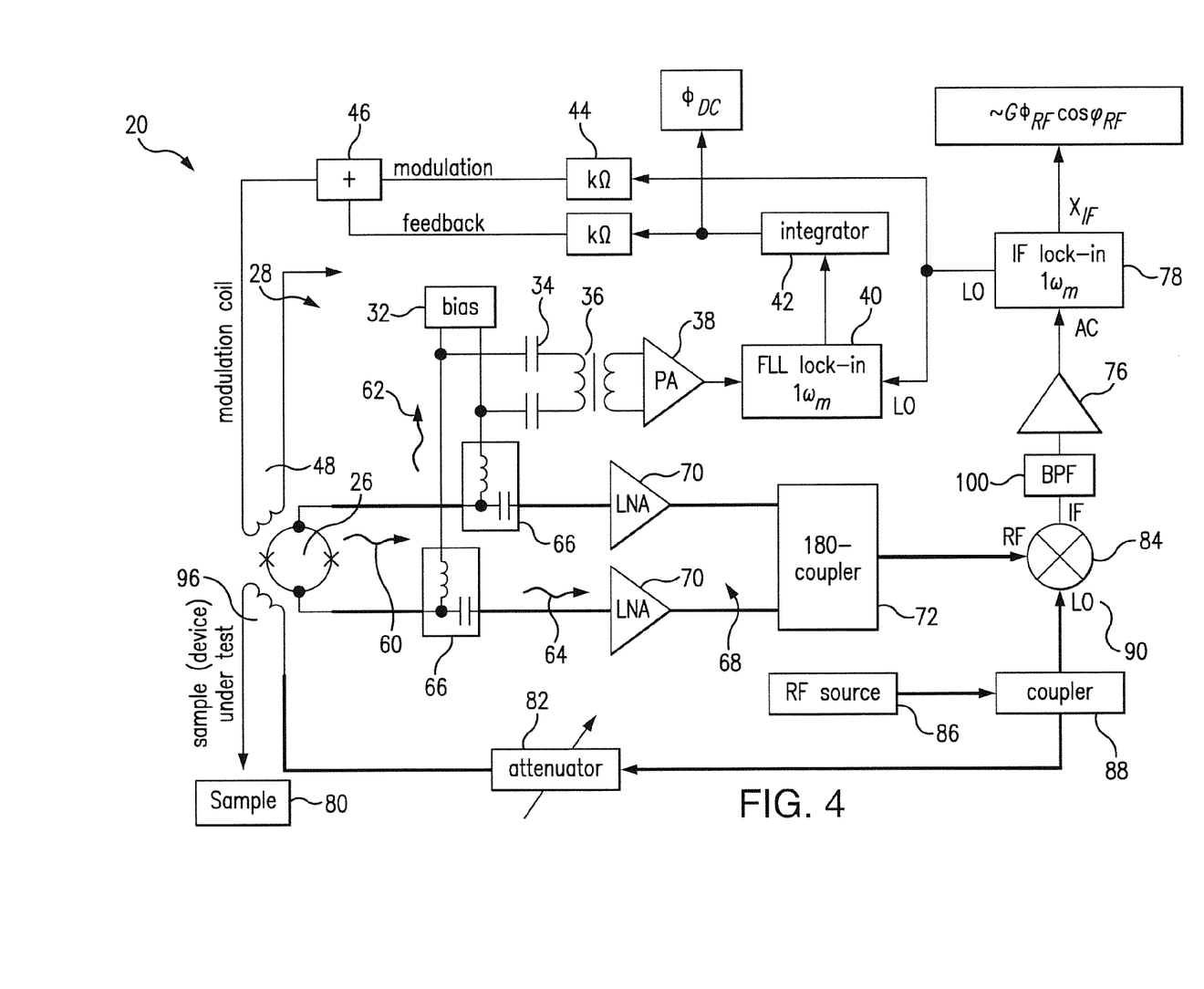
Figure 5:
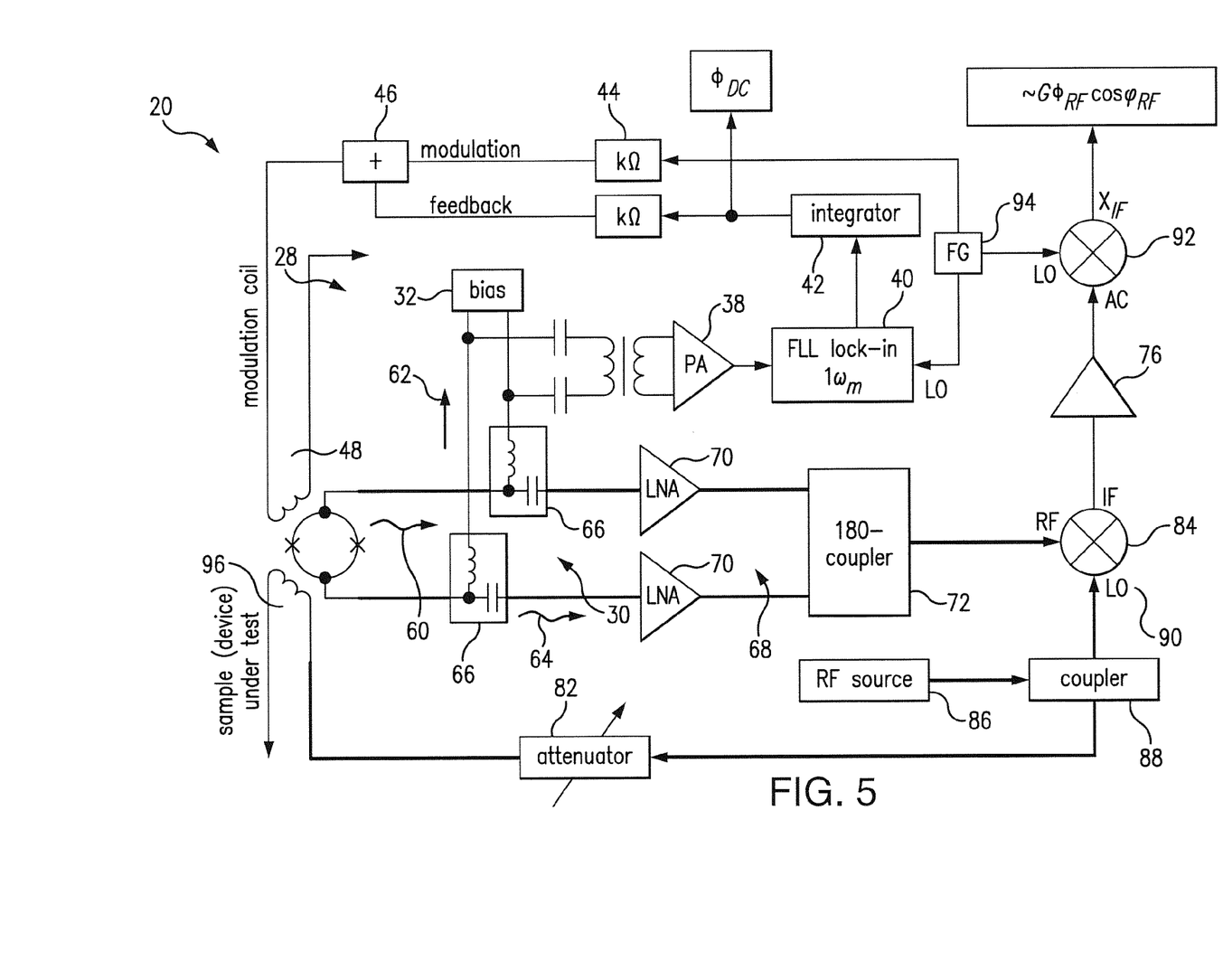
Figure 6:
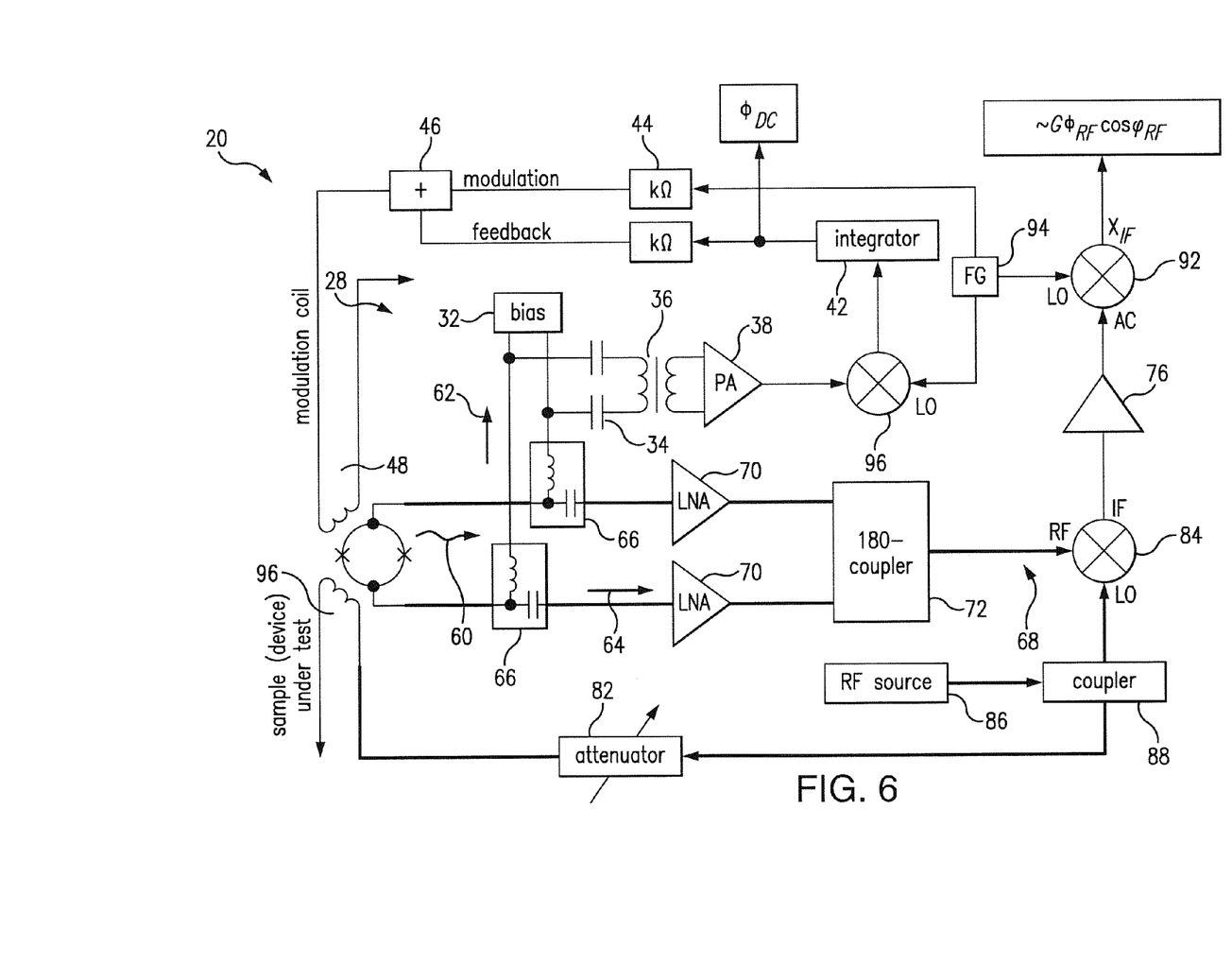

The RF lock-in amplifier 74, shown in FIGS. 2, 3 and 7, may be replaced by RF mixer/multiplier 84, as shown in FIGS. 4-6. In this case, the RF power from an RF source 86 is delivered via a coupler 88 to the mixer's 84 local-oscillator 90 and to the sample 80 under study. In this embodiment the range of the RF frequency may extend from approximately 50 MHz up to 200 GHz.

As shown in FIGS. 4 and 7, a band-pass filter 100 may be coupled between the RF lock-in 74 (or mixer 84) and the amplifier 76.

Referring to FIG. 5, showing an additional version of the scheme presented in FIG. 4, IF lock-in amplifier 78 is replaced with a multiplier 92. In this embodiment, a function generator 94 provides modulation signal to the FLL circuit 28 and the reference signal ω$_m$ to the multiplier 92 through the local oscillator LO.

Referring to FIG. 6, which shows another embodiment of the scheme presented in FIG. 5, the FLL lock-in amplifier 40 is replaced with a multiplier 96.

Referring to FIG. 7, presenting a further alternative embodiment of the subject magnetometer, the measuring scheme includes a differential line 102 through which the RF signal generated by the RF lock-in 74 is coupled to the SQUID circuit 22 enveloped in a cryogenic equipment 108. A low-pass RF filter 103 passes the filtered RF signal to the attenuator 82. The signal further is split in the 180-degree coupler 110 to become a differential signal which is fed into a pair of bias-T circuits 104 where the differential RF signal is combined with the modulation and feedback signals coming from the LLP 28. The superimposed signals are inductively coupled to the SQUID circuit 22 via the modulation coil 106. By varying the attenuator 82 settings, dependence of IF signal as a function of RF magnetic flux may be acquired.

Lock-In Simulation

To analytically model the double lock-in approach of the present invention, Eq. (1) can be approximated for I$_b$>2I$_c$ as follows:

$$V_{SQUID} = 0.25RI_c\left(\frac{I_b}{I_c} + \sqrt{\frac{I_b^2}{I_c^2}-4} + \left(\sqrt{\frac{I_b^2}{I_c^2}-4} - \frac{I_b}{I_c}\right)\cos\frac{2\pi\Phi}{\Phi_0}\right) \quad (\text{Eq. 4})$$

Around Φ=nΦ$_0$ (n=0, 1, 2, . . . ), (Eq. 4) may be expanded as $$V(\Phi) = \frac{RI_c}{2}\sqrt{\frac{I_b^2}{I_c^2}-4} + 2\pi^4 RI_c\left(\frac{I_b}{I_c}\sqrt{\frac{I_b^2}{I_c^2}-4}\right)\left(\frac{\Phi}{\Phi_0}\right)^2 - \ldots \quad (\text{Eq. 5})$$

$$\text{Here } G_{SQUID} = [\partial V \cdot \partial\Phi]_{0.25\Phi_0} = \pi RI_c/\sqrt{2} \quad (\text{Eq. 6})$$

is the SQUID gain at Φ=(n+0.25)Φ$_0$.
The following fluxes are applied to the SQUID:
RF flux Φ$_{RF}$ sin(ω$_{RF}$t+φ$_{RF}$),
modulation flux Φ$_m$ sin(ω$_m$t+φ$_m$), and
parasitic static offset from nΦ$_0$ due to FLL imperfections Φ$_{off}$.
The coherent spurious RF voltage at the input of RF lock-in 74 is $$V_{sp}\sin(\omega_{RF}t+\phi_{sp}) \quad (\text{Eq.7})$$

Taking into account a high-pass filtering effect of the bias-T 66, the total voltage seen by RF lock-in 74 is:

$$V_{RF}=G_{LNA}G_{SQUID}\Phi_{RF}\sin(\omega_{RF}t+\phi_{RF})(\Phi_{RF}\sin(\omega_{RF}t+\phi_{RF})+2\Phi_m\sin(\omega_m t+\phi_m)+2\Phi_{off})+V_{sp}\sin(\omega_{RF}t+\phi_{sp})$$ (Eq. 8)

where $G_{LNA}$ is the LNA 70 voltage gain.

Multiplying (Eq. 5) by RF lock-in reference $G_{RF}\sin(\omega_{RF}t)$ and retaining only DC and low frequency terms yields for RF lock-in in-phase output:

$$X_{RF}=G_{RF}G_{LNA}G_{SQUID}\Phi_m\sin(\omega_m t+\phi_m)\Phi_{RF}\cos\phi_{RF}+G_{RF}G_{LNA}G_{SQUID}\Phi_{off}\Phi_{RF}\cos\phi_{RF}+0.5G_{RF}V_{sp}\cos\phi_{sp}$$ (Eq. 9)

where $G_{RF}$ is the total gain of RF lock-in.

Since signals associated with the parasitic DC offset and spurious RF voltage appear in Eq. 8 as DC terms, they will be removed after IF lock-in demodulation 78. Multiplying (Eq. 8) by the IF lock-in reference $G_{IF}\sin(\omega_m t)$ yields IF lock-in in-phase output, that is IF signal:

$$X_{IF}=0.5G_{IF}G_{RF}G_{LNA}G_{SQUID}\Phi_m\cos\phi_m\Phi_{RF}\cos\phi_{RF}$$ (Eq. 10)

where $G_{IF}$ is the total gain of the IF lock-in 78.

By electing $\phi_m=0$, the IF signal may be maximized:

$$X_{IF}=G_{TOT}\Phi_m\Phi_{RF}\cos\phi_{RF}$$ (Eq. 11)

where $G_{TOT}=0.5\,G_{IF}G_{RF}G_{LNA}G_{SQUID}$ is the net gain of entire system.

Both $G_{TOT}$ and $\Phi_m$ in the right hand side of (Eq. 10) are fixed and are well known.

Experimental Setup

Squid

A commercial $YBa_2Cu_3O_7$ DC SQUID on bi-crystal $SrTiO_3$ substrate with effective loop area of $32\times32$ $\mu m^2$ and single modulation coil was used [Star Cryoelectronics]. The SQUID washer of $1\times1$ mm in size was glued onto the end face of tapered sapphire rod. The SQUID's critical current was 11 µA, normal junction resistance was 3 Ohm, contact resistance was less than 1 Ohm, and self-inductance was 200 pH. The measurements were done in a liquid nitrogen bath at 77.4 K without any shielding.

Readout Electronics

All electronics were operated at room temperature and included three main sections (shown in FIGS. 2-7): synchronous RF demodulator 74 (or 84), synchronous IF demodulator 78 (or 92), and FLL 28.

Differential signaling, shown in FIG. 7, was implemented for low-level RF and AC signals, by wire-bonding the SQUID 22 and modulation coil 106 terminals to the inner conductors of two pairs of $50\Omega$ stainless steel coaxial cables. This approach takes advantage of both the SQUID and modulation coil being a naturally balanced source and load, respectively, while eliminating a common mode noise, the differential connection 102, shown in FIG. 7. This also resolves the issue of impedance mismatch between the SQUID and RF electronics, which, in turn leads to a wideband system. The Bias-Ts 66 with 50 kHz DC bandwidth diplex the RF and DC/AC signals.

RF demodulator included two pairs of balanced ultra-low-noise amplifiers (LNAs) 70, 180-degree hybrid coupler 72, and RF lock-in amplifier 74 with 200 MHz RF bandwidth [SRS844]. The custom designed LNA 70 utilizing a p-HEMT transistor yielded 21 dB power gain, 50-900 MHz bandwidth, and 0.6 dB noise figure (input referred noise density of 0.25 nV/$\sqrt{Hz}$) for $50\Omega$ at 293 K. After preamplification with the LNAs 70, the RF signal was converted from the differential into single-ended by 180-coupler 72 and was fed into RF lock-in 74 internally referenced to $\omega_{RF}$. Depending on the level of RF magnetic field, the net gain of RF lock-in 74 varied from $10^3$ to $10^5$. The best achievable RF lock-in sensitivity in the test setup was 100 µV ($10^5$ RF lock-in net gain), limited by the spurious RF signals. Since the RF lock-in had a minimal time constant of 100 µs, the maximum modulation frequency $\omega_m$ was limited at 2 kHz.

After passing through an active low-noise band-pass filter 100 centered at $\omega_m$, the output of RF lock-in was fed into IF lock-in 78 internally referenced to $\omega_m$. The IF lock-in net gain was 10, and the time constant was from 100 to 500 ms. A standing wave formed between the SQUID 22 and 180-coupler 72 created a spurious RF signal that was amplitude-modulated at 2 $\omega_m$. The spurious RF signal was rejected by IF lock-in 78 referenced to $\omega_m$.

The double lock-in technique (RF lock-in and IF lock-in) eliminates spurious RF signals due to coherent pick-up by the wiring loop connecting the SQUID to coaxial cables, near-field coupling (cross-talk) between the excitation and detection arms of entire setup, leakage of RF pick-up from DC into RF port of the bias-Ts, as well as RF leakage from LO (local oscillator) into RF port of the RF lock-in.

FLL 28 with 2 kHz sine-wave modulation and 100 Hz bandwidth was designed with capacitively coupled input transformer 36, differential ultra-low-noise preamplifier 38, FLL lock-in amplifier 40 externally referenced to $\omega_m$, integrator 42, and current adder 46. With 2 Ohm input resistor 44 at room temperature, the preamplifier 38 had a gain of $10^5$ and voltage noise density of <0.5 nV/$\sqrt{Hz}$ at 2 kHz.

Experimental Data and Discussion

To produce RF flux of known amplitude, the attenuated output of RF lock-in internal oscillator 90 was injected into the SQUID modulation coil 106 via differential transmission line 102. Considering that the modulation coil presents a short to the feedline, the amplitude of RF flux produced by the coil is calculated as $$\Phi_{RF}=aI_{RFm}=a2\sqrt{2P_{RFm}/Z_0},$$ (Eq. 12)

where a=2.222 $\Phi_0$/mA is the geometrical coefficient relating the SQUID flux to the modulation coil current, $P_{RF}$ is the RF power, and $Z_0=100\Omega$ is the characteristic impedance of the differential feedline 102 of FIG. 7.

To verify that observed IF signal ($\sim G\Phi_{RF}\cos\phi_{RF}$) at the output of the demodulation unit (IF lock-in 78 in FIGS. 4-2 and 7, or multiplexer 92 in FIGS. 5-6) is associated with the SQUID RF voltage rather than spurious RF signals, the dependence of IF signal versus static flux at 190 MHz was acquired in an open loop regime (without the FLL).

If the amplitudes of both RF and IF modulation fluxes are small compared to $\Phi_0$, the IF signal represents a second derivative of V-$\Phi$ function, which at $I_b=2I_c$ is given by $$V''_{\Phi\Phi}=\pi^2 V(\Phi)$$ (Eq. 13).

Figure 10:
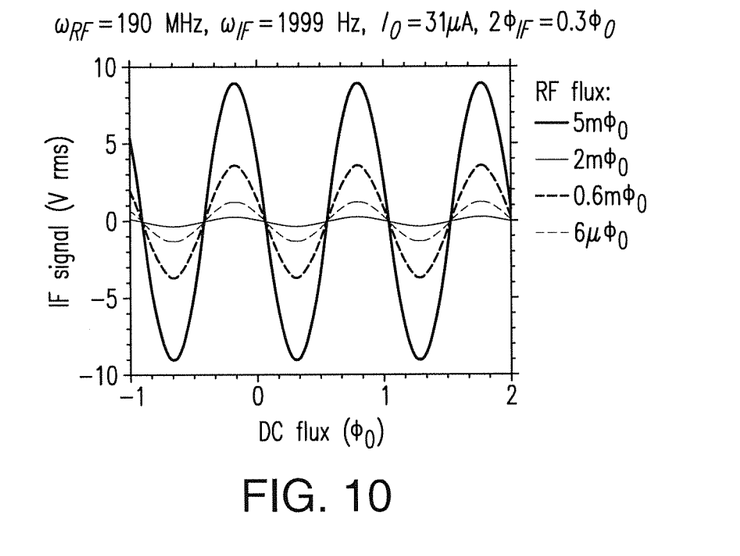
FIG. 10 is a diagram showing IF signal vs. static flux measured in the open loop regime at 190 MHz and modulation flux amplitude $\Phi_m$-0.15$\Phi_0$ for several amplitudes of RF flux.

The SQUID was operated under conditions $\Phi_m\sim0.1\Phi_0$ and $\Phi_{RF}\ll\Phi_0$. The static flux was produced by means of DC current applied to the modulation coil. The dependence of IF signal on the static flux shown in FIG. 10, yields an interference pattern with a period of $1\Phi_0$ as expected. The data also confirms that IF signal is representative of both amplitude and phase of RF flux.

Figure 11:
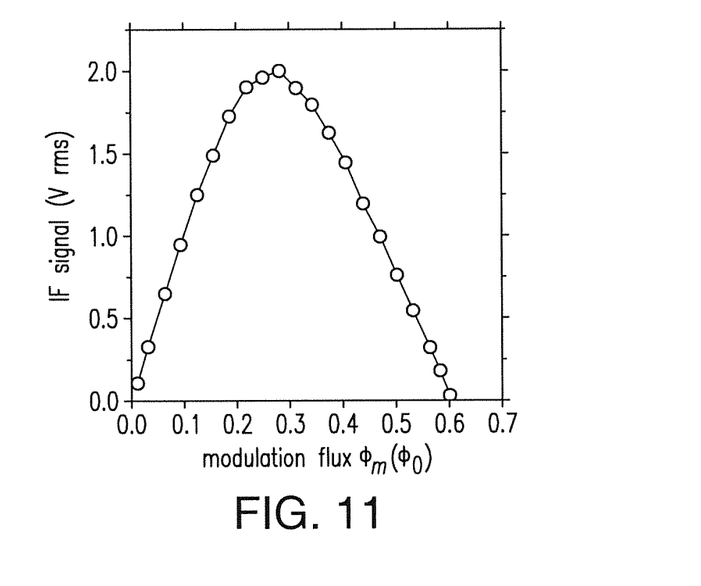
FIG. 11 is a diagram showing IF signal vs. modulation flux amplitude $\Phi_m$ measured in the closed loop regime at 165 MHz for RF flux amplitude of 2 m $\Phi_0$.

FIG. 11 shows the IF signal as a function of modulation flux amplitude $\Phi_{mod}$ measured in the closed loop regime. RF frequency was 165 MHz, RF flux amplitude $\Phi_{RF}=2$ m$\Phi_0$, under optimal bias, with static flux locked at n$\Phi_0$, n=0, 1, 2, .... For $\Phi_{RF}\ll\Phi_0$ the diagram is representative of the first derivative of V-$\Phi$ function. As expected, the maximum in IF signal occurs near the point $\Phi_m \sim 0.25\Phi_0$, where V-Φ function has the highest slope, after which IF signal reduces back to zero at $\Phi_m \geq 0.5\Phi_0$.

Figure 12:
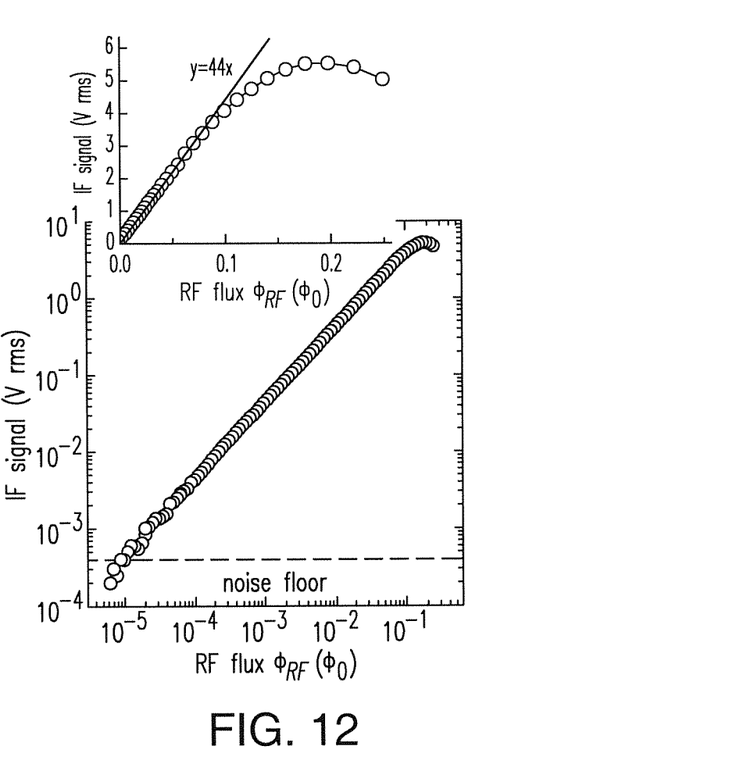
FIG. 12 is a diagram of log-log plot of IF signal scaled to 10 mV RE lock-in sensitivity vs. RF flux amplitude $\Phi_{RF}$ measured in the closed loop regime at 190 MHz (the inset in the diagram represents the IF signal vs. $\Phi_{RF}$ on a linear scale).

FIG. 12 shows the IF signal measured as a function of RF flux in the closed loop regime. The IF signal is referred to IF lock-in input and normalized to 100 µV RF lock-in sensitivity ($10^5$ net gain). As predicted by (Eq. 3), the dependence is linear over four decades of RF flux amplitude, and may be used for the accurate calibration. Such dynamic range is sufficient for most applications.

Substitution of $G_{SQUID} \sim 50$ µV/$\Phi_0$, $G_{LNA}=140$, $G_{RF}=1000$ (10 mV RF lock-in sensitivity), $G_{IF}=20$, and $\Phi_m \sim \Phi_0/4$ into (Eq. 10) yields for the small-signal sensitivity of the subject magnetometer 0.5 $G_{IF}G_{RF}G_{LNA}G_{SQUID}\Phi_m/\sqrt{2} \square 1$ mV/µ$\Phi_0$ (44 Vrms/$\Phi_0$), which is in agreement with a linear fit to the experimental data (shown in FIG. 11).

At small $\Phi_{RF}$, the IF signal dependence is limited by LNA noise: the observed IF signal noise floor of about 4 mV (cf., 2 mV/√Hz) is in agreement with the calculated above LNA input referred flux noise density of 2.2µ$\Phi_0$/√Hz. IF signal reaches a maximum around $\Phi_{RF} \sim 0.2\Phi_0$ due to suppression of the junctions critical current, which in turn reduces $G_{SQUID}$. Even a larger RF flux of $\Phi_{RF} > \Phi_0/4$ causes FLL to perform out of lock, because $\Phi_m + \Phi_{RF}$ exceeds $\Phi_0/2$.

The DC SQUID RF magnetometer capable of detecting coherent magnetic field from 50 to 200 MHz and higher has been demonstrated. The system offers the RF dynamic range of more than four orders of magnitude, with the flux noise density at 200 MHz of less than 10µ$\Phi_0$/√Hz.

Unlike the existing SQUID FLLs with bandwidth restricted by transmission line delays in readout electronics, the upper frequency in the subject RF magnetometer is limited by RF lock-in bandwidth only and may be extended into GHz range by using a discreet multiplier (mixer), which also allows increasing the modulation frequency. An implementation of carrier/phase recovery module may aid in sensing the harmonic RF signals with unknown phase.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular locations of the elements may be reversed or interposed, all without departing from the spirit or scope of the invention as defined in the appended claims.

What is being claimed is:

1. A Direct Current (DC) Superconducting Quantum Interference Device (SQUID) magnetometer operating at a bandwidth of 200 MHz and higher, comprising:

a DC SQUID circuit, a source of low-frequency modulation flux $\Phi_m \sin(\omega_m t + \phi_m)$ inductively coupled to an input of said DC SQUID circuit, wherein $\Phi_m$ is the amplitude of the low-frequency modulation flux, $\omega_m$ is the frequency of the low-frequency modulation flux, and $\phi_m$ the phase of the low-frequency modulation flux, a source of Radio Frequency (RF) flux $\Phi_{RF}(t) \sin(\omega_{RF} t + \phi_{RF})$ inductively coupled to said input of said DC SQUID circuit, wherein $\Phi_{RF}(t)$ is an amplitude of said RF flux, $\omega_{RF}$ is a frequency of the RF flux, and $\phi_{RF}$ is the phase of the RF flux, wherein said $\omega_m \ll \omega_{RF}$, and wherein said source of RF flux includes a magnetic flux emanating from a sample under study, wherein, responsive to said RF flux and low-frequency modulation flux coupled thereto, said DC SQUID produces an output RF voltage binary phase modulated at said frequency $\omega_m$ between 0° and 180°, a demultiplexing circuit coupled to an output of said DC SQUID to separate said output RF voltage into an RF signal component and a low-frequency signal component, a flux-locked loop circuit coupled between said input and output of said DC SQUID circuit to inductively couple a feedback flux n$\Phi_0$, n=0, 1, 2 . . . to said input of said DC SQUID circuit, where $\Phi_0$ is the magnetic flux quantum, said flux-locked loop circuit being coupled to an output of said demultiplexing circuit to receive said low-frequency signal component therefrom, said low-frequency signal component being processed in said flux-locked loop circuit to generate said feedback flux n$\Phi_0$, an RF demodulation circuit receiving said RF signal component of said binary phase modulated output RF voltage and double-locking said RF signal component at said $\omega_m$ and $\omega_{RF}$ to produce an output DC linear signal representative of said RF flux, said RF demodulation circuit including a first demodulation unit referenced to said $\omega_{RF}$, and a second demodulation unit referenced to said $\omega_m$ and coupled to an output of said first demodulation unit, and an RF power source coupled to said first demodulation unit and said source of RF flux, wherein said second demodulation unit is coupled to said flux-locked loop circuit to control said low-frequency modulation flux.

2. The DC SQUID magnetometer of claim 1, wherein said first demodulation unit includes an RF lock-in amplifier referenced to said $\omega_{RF}$.

3. The DC SQUID magnetometer of claim 1, wherein said first demodulation unit includes an RF mixer/multiplier circuit.

4. The DC SQUID magnetometer of claim 1, wherein said second demodulation unit includes an Intermediate Frequency (IF) lock-in amplifier referenced to said $\omega_m$.

5. The DC SQUID magnetometer of claim 4, wherein said source of low-frequency modulation flux includes a local oscillator signal received from said IF lock-in amplifier.

6. The DC SQUID magnetometer of claim 1, wherein said second demodulation unit includes a multiplier circuit.

7. The DC SQUID magnetometer of claim 1, wherein said flux-locked loop (FLL) circuit includes an FLL lock-in amplifier referenced to said $\omega_m$.

8. The DC SQUID magnetometer of claim 1, wherein said FLL circuit includes a multiplier unit.

9. The DC SQUID magnetometer of claim 1, wherein said source of low-frequency modulation flux includes a function generator producing said low-frequency modulation flux to be coupled to said flux-locked loop circuit and to said second demodulation unit.

10. The DC SQUID magnetometer of claim 1, further including an attenuator coupled between said first demodulation unit and said sample under study.

11. The DC SQUID magnetometer of claim 1, further comprising a modulation coil located in close proximity of and inductively coupled to said DC SQUID circuit to couple said low-frequency modulation flux and said feedback flux to said DC SQUID circuit, and an RF coil located in close proximity of and inductively coupled to said DC SQUID circle to couple said RF flux emanating from said source of RF flux to said DC SQUID circuit.

12. The DC SQUID magnetometer of claim 1, wherein said RF demodulation circuit includes at least one balanced low-noise amplifier (LNA) coupled to an output of said demultiplexing circuit and an amplifier coupled between said first and second demodulation units.

13. The DC SQUID magnetometer of claim 1, wherein said demultiplexing circuit includes at least one bias-T circuit.

14. The DC SQUID magnetometer of claim 1,
wherein said $\omega_m$ falls within an output bandwidth of said first demodulator unit.

15. A method for operating a Direct Current (DC) Superconducting Quantum interference Device (SQUID) magnetometer at a bandwidth of 200 MHz and higher, comprising the steps of:
  (a) providing a Radio Frequency (RF) power to a sample under study,
  (b) inductively coupling an RF flux $\omega_{RF}(t)\sin(\omega_{RF}t+\phi_{RF})$ emanating from said sample under study and superimposed on a low-frequency modulation flux $\Phi_m \sin(\omega_m t + (\phi_m T + \phi_m)$ to a DC SQUID circle,
  wherein $\Phi_m$, $\omega_m$ and $\phi_m$, are an amplitude, frequency, and phase of said modulation flux, respectively, and $\Phi_{RF}\omega_{RF}$, and $\phi_{RF}$, are an amplitude, frequency and phase of said RF flux received from the sample under study, respectively, and wherein said $\omega_m<<\omega_{RF}$, locking said DC SQUID circuit at quasi-static flux $n\Phi_0$, n=0, 1, 2, . . . , where $\Phi_0$ is the magnetic flux quantum,
  (c) acquiring at an output of said DC SQUID circuit an output RF voltage binary phase modulated at said frequency $\omega_m$ between 0° and 180°,
  (d) demultiplexing said output RF voltage into an RF signal component and a low-frequency signal component,
  (e) coupling a flux-locked loop between the output and input of the DC SQUID circle, feeding said low-frequency signal component into said flux-locked loop circuit to generate a feedback flux, and locking said DC SQUID circuit at quasi-static flux $n\Phi_0$, n=0, 1, 2, . . . , where $\Phi_0$ is the magnetic flux quantum,
  (f) demodulating sequentially said RF signal component of said binary phase modulated output RF voltage at a first and second demodulation units referenced to said $\omega_{RF}$ and $\omega_m$, respectively, to obtain, at an output of said second demodulation unit, a DC linear output signal representative of said RF flux emanating from said sample under study, and
  (g) coupling said second demodulation unit to said flux-locked loop circuit.

* * * * *